US008169723B2

(12) United States Patent
Morioke

(10) Patent No.: US 8,169,723 B2
(45) Date of Patent: May 1, 2012

(54) VIBRATION ACTUATOR, LENS BARREL AND CAMERA

(75) Inventor: Toshikazu Morioke, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/369,492

(22) Filed: Feb. 11, 2009

(65) Prior Publication Data

US 2009/0207512 A1 Aug. 20, 2009

(30) Foreign Application Priority Data

Feb. 19, 2008 (JP) ................................ 2008-037648

(51) Int. Cl.
*G02B 7/02* (2006.01)

(52) U.S. Cl. ........................................ 359/824; 359/819

(58) Field of Classification Search .......... 359/819–824, 359/696; 310/348, 317, 323.01, 323.02
See application file for complete search history.

(56) References Cited

U.S. PATENT DOCUMENTS 4,562,374 A 12/1985 Sashida ......................... 310/328
5,831,370 A * 11/1998 Sugaya .................... 310/323.01
5,852,336 A * 12/1998 Takagi ..................... 310/323.01
5,854,529 A * 12/1998 Ashizawa et al. ........ 310/323.01
6,078,438 A * 6/2000 Shibata et al. ................ 359/819
7,671,516 B2 * 3/2010 Adachi et al. ................. 310/348

FOREIGN PATENT DOCUMENTS

JP 1-17354 3/1989

* cited by examiner

*Primary Examiner* — Mohammed Hasan
(74) *Attorney, Agent, or Firm* — Ditthavong Mori & Steiner, P.C.

(57) ABSTRACT

To provide a vibration actuator having good driving performance even when miniaturized, and a lens barrel and camera provided with the same. A first aspect of the present invention is to provide a vibration actuator comprising, an electromechanical conversion element, having a first joining face, and which is subject to excitation, an elastic body having a second joining face which is joined to the first joining face, and a driving face which gives rise to vibration waves as a result of said excitation, and a relative moving member, having a contact face which is in pressure contact with the driving face, which is driven by the vibration waves, and which moves relative to the elastic body, wherein an outer shape of said first joining face has a shape which differs from an outer shape of said contact face.

12 Claims, 5 Drawing Sheets

1
2
8
9
10
4
7
5
3
6
L

VIBRATION ACTUATOR, LENS BARREL AND CAMERA

The present application claims priority under 35 U.S.C. §119 to Japanese Patent Application No. 2008-037648 filed on Feb. 19, 2008. The content of the application is incorporated herein by reference in its entirety.

BACKGROUND OF THE INVENTION

1. Field of the Invention

The present invention relates to a vibration actuator, and a lens barrel and a camera provided with the same.

2. Description of the Related Art

In the prior art, a vibration actuator is known wherein progressive vibration waves (below referred to as progressive waves) are generated at a driving face of an elastic body utilizing the expansion and contraction of an electromechanical conversion element, which generates elliptical motion at the driving face by these progressive waves, whereby a relative moving member making pressure contact with the wave crests of the elliptical motion is driven (for example, refer to Japanese Examined Patent Publication No. H1-17354.

SUMMARY OF THE INVENTION

In recent years, there has been demand to miniaturize such vibration actuators. However, as the vibration actuators are miniaturized, the surface area of the joining face of the electromechanical converter and the elastic body becomes smaller, and if the conditions of the electromechanical converter other than the thickness and dielectric constant and the like are fixed, the capacitance of the electromechanical converter will decrease. As the capacitance of the electromechanical converter is reduced, the driving performance such as the startup torque of the vibration actuator and the like will accordingly be reduced.

An objective of the present invention is to provide a vibration actuator which has good driving performance even when miniaturized, and a lens barrel and camera provided with the same.

A first aspect of the present invention is to provide a vibration actuator comprising, an electromechanical conversion element having a first joining face and which is subject to excitation, an elastic body having a second joining face which is joined to the first joining face and a driving face which gives rise to vibration waves as a result of said excitation, and a relative moving member having a contact face which is in pressure contact with the driving face which is driven by the vibration waves and which moves relative to the elastic body, wherein an outer shape of said first joining face has a shape which differs from an outer shape of said contact face.

The contact face may be round, and in the first joining face, a width in a direction orthogonal to a progressive direction of the relative moving member may differ depending on the position in the progressive direction of the relative moving member.

The contact face may be round, and in the first joining face, a width in a radial direction of the contact face may be non-uniform.

The outer shape of the contact face may be smaller than an outer shape of the second joining face.

An outer shape of the driving face may be smaller than an outer shape of the second joining face.

The outer shape of the first joining face and the outer shape of the second joining face may be elliptical shapes.

A short radius of the second joining face may be approximately the same as a length in a direction parallel to the short radius of the driving face.

The second joining face may have a shape which is approximately the same as the first joining face.

The driving face may have a similar shape to the contact face.

The outer shape of the contact face may be round.

A second aspect of the present invention is to provide an electromechanical conversion element comprising, a joining face having an outer shape other than round and which is joined to an elastic body, and a round through-hole formed in a central portion of the joining face.

A third aspect of the present invention is to provide an elastic body comprising, a joining face having an outer shape other than round, and which is joined to an electromechanical conversion element, and a driving face which gives rise to vibration waves due to excitation of the electromechanical conversion element.

The driving face may be round.

The outer shape of the joining face may be an elliptical shape.

An outer shape of the driving face may be smaller than the outer shape of the joining face.

A fourth aspect of the present invention is to provide a lens barrel comprising the vibration actuator according to the above aspects.

The lens barrel may, further comprise, a lens unit driven by the vibration actuator, a lens retaining mount which retains the lens unit, and a housing which encloses the lens retaining mount wherein, the vibration actuator is positioned between the lens retaining mount and the housing.

A fifth aspect of the present invention is to provide a camera comprising the vibration actuator according to above aspects.

According to the present invention, it is possible to provide a vibration actuator which has good driving performance even when miniaturized, and a lens barrel and camera provided with the same.

DETAILED DESCRIPTION OF THE PREFERRED EMBODIMENT

Below, embodiments of the present invention are explained with reference to the figures. Further, the following embodiments explain the vibration actuator giving an ultrasonic wave motor as an example.

(First Embodiment)

Figure 1:
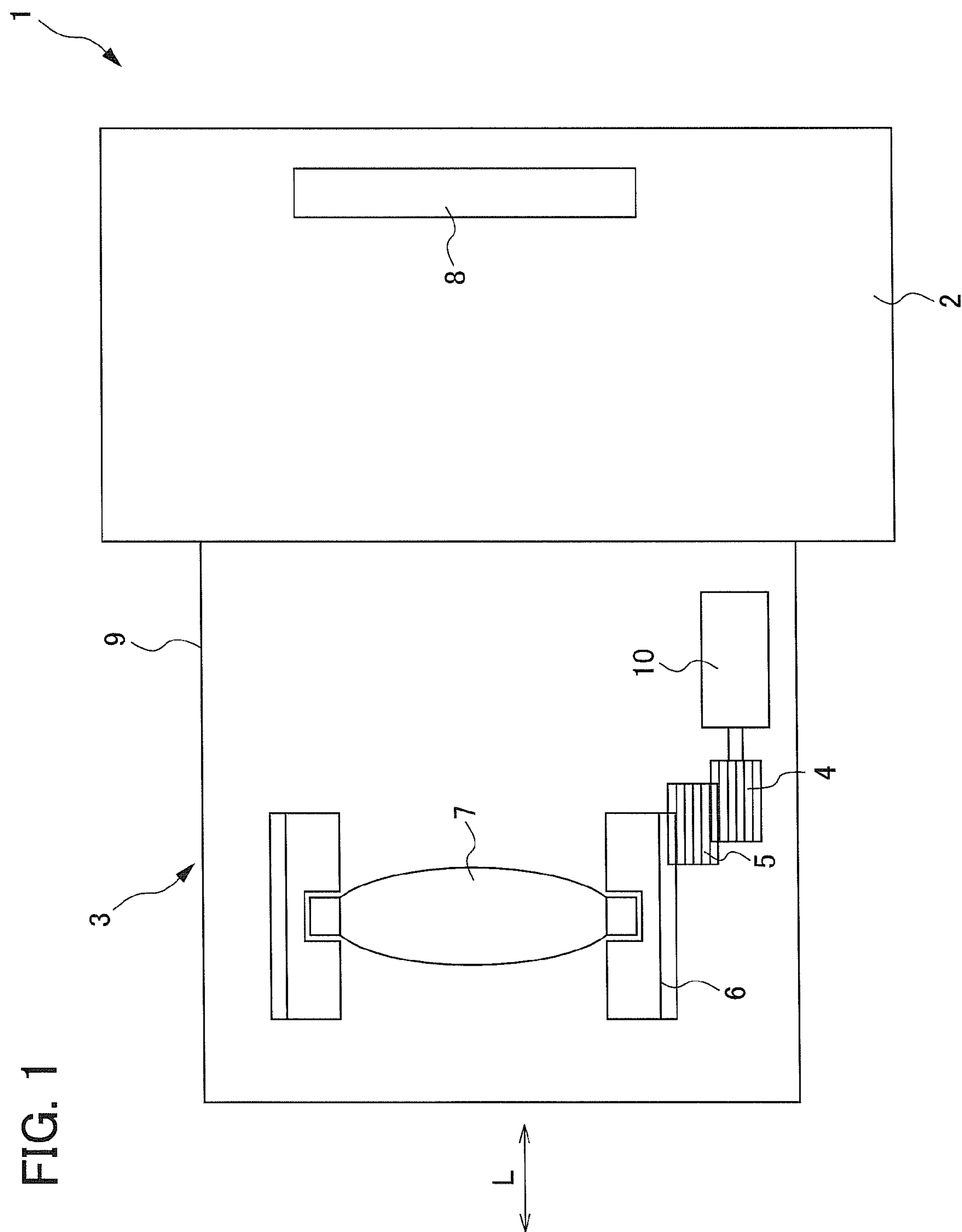
FIG. 1 is a drawing explaining the camera of the first embodiment.
Figure 2:
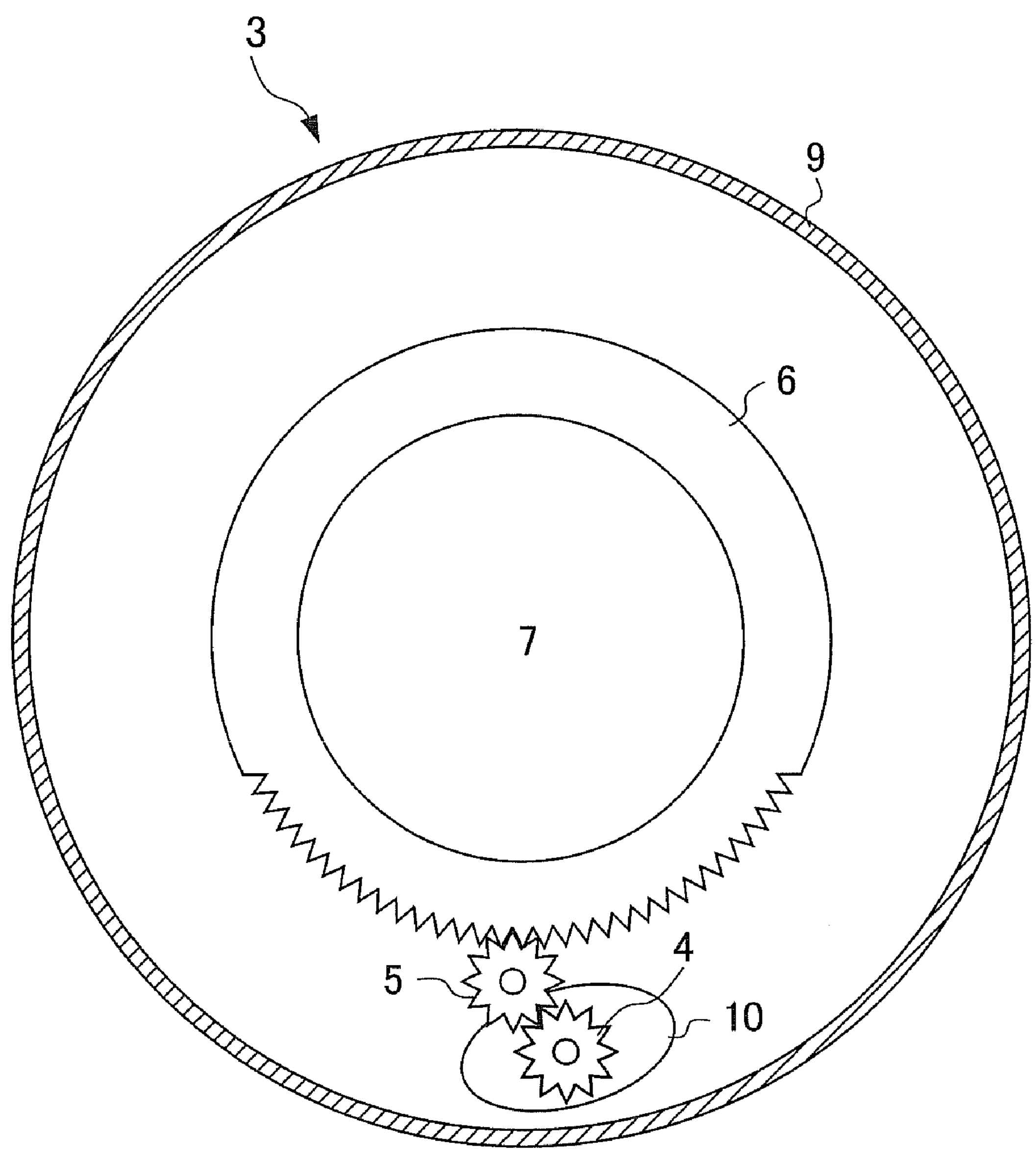
FIG. 2 is a drawing of the lens barrel in the camera of FIG. 1, viewed from the photographic object side.

FIG. 1 is a drawing explaining the camera 1 of the first embodiment. FIG. 2 is a drawing showing the lens barred 3 in the camera 1 viewed form the photographic object side.

The camera 1 of the first embodiment is provided with a camera body 2 having an imaging element, and a lens barrel 3 having a lens 7.

The lens barrel 3 is an interchangeable lens which is removable from the camera body 2. Further, in the present embodiment, the lens barrel 3 is shown by an example of an interchangeable lens, but this is not a limitation, and it may for example also be a lens barrel which is integrated with the camera body.

The lens barrel 3 is provided with a lens 7, a cam tube 6, gears 4, 5, an ultrasonic wave motor 10, enclosed in a housing 9, and the like. In the present embodiment, the ultrasonic wave motor 10, as shown in FIG. 2, is located in the gap between the cam tube 6 and the housing 9. The ultrasonic wave motor 10 is used as an actuator for driving the lens 7 during the focus operation of the camera 1, and the driving power obtained from the ultrasonic wave motor 10 is transmitted to the cam tube 6 via the gears 4, 5. The lens 7 is a focusing lens retained by the cam tube 6, and is moved approximately parallel to the optical axis direction (the direction of the arrow L in FIG. 1) by the driving power of the ultrasonic wave motor 10, to carry out focusing.

In FIG. 1, an image is formed of the photographic object at the imaging surface of the imaging element 8 by a lens group (including the lens 7) not shown in the drawing, provided in the lens barrel 3. The formed image of the photographic object is converted to an electric signal by the imaging element 8, and image data is obtained by A/D conversion of this signal.

Figure 3:
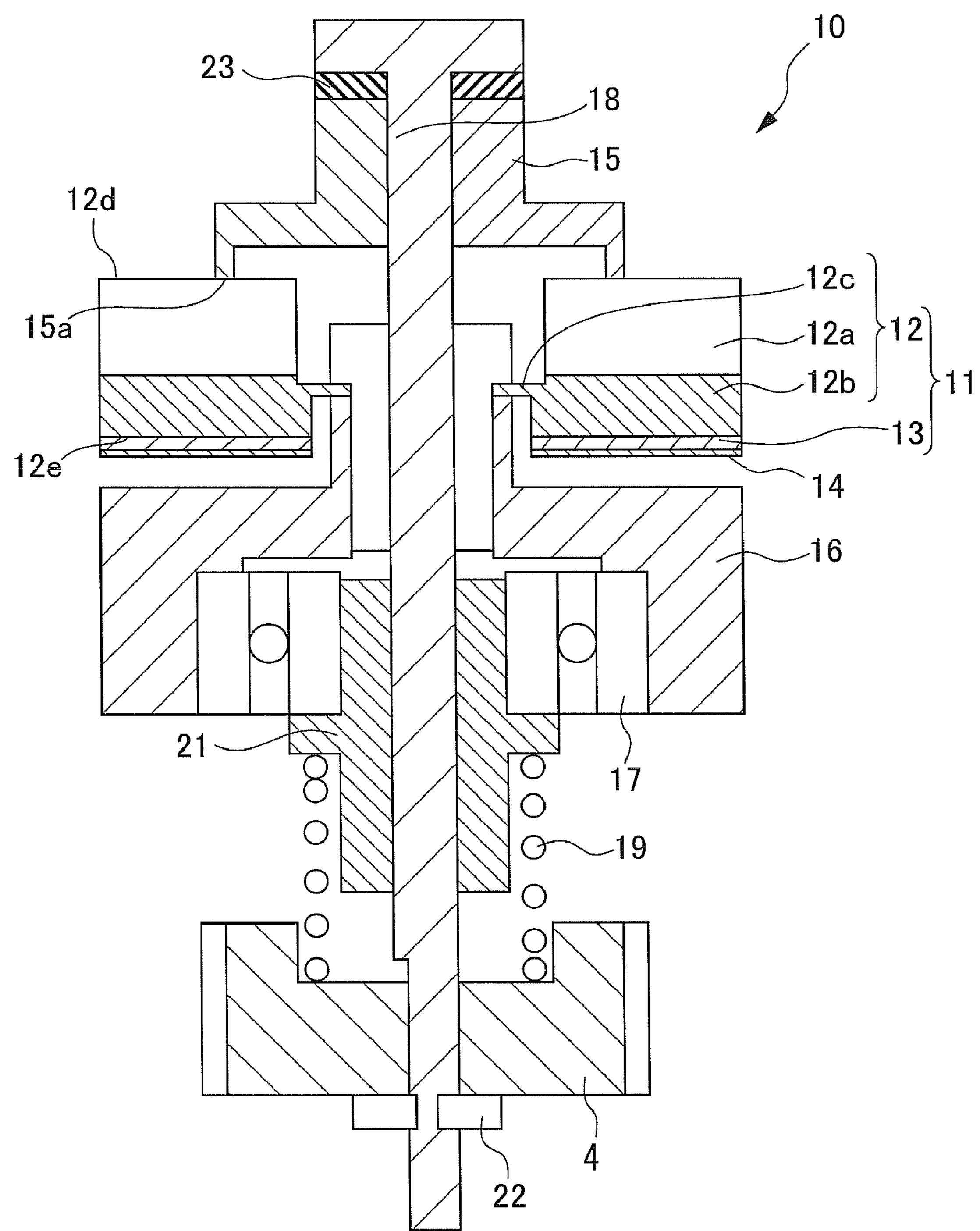
FIG. 3 is a cross sectional drawing of the ultrasonic wave motor of the first embodiment.

FIG. 3 is a cross sectional drawing of the ultrasonic wave motor 10 of the first embodiment.

The ultrasonic wave motor 10 of the first embodiment is provided with a vibrating element 11, a moving element 15, an output shaft 18, a pressurizing member 19, and the like, and is configured so that the vibrating element 11 side is fixed, and the moving element 15 is rotationally driven.

Figure 4A:
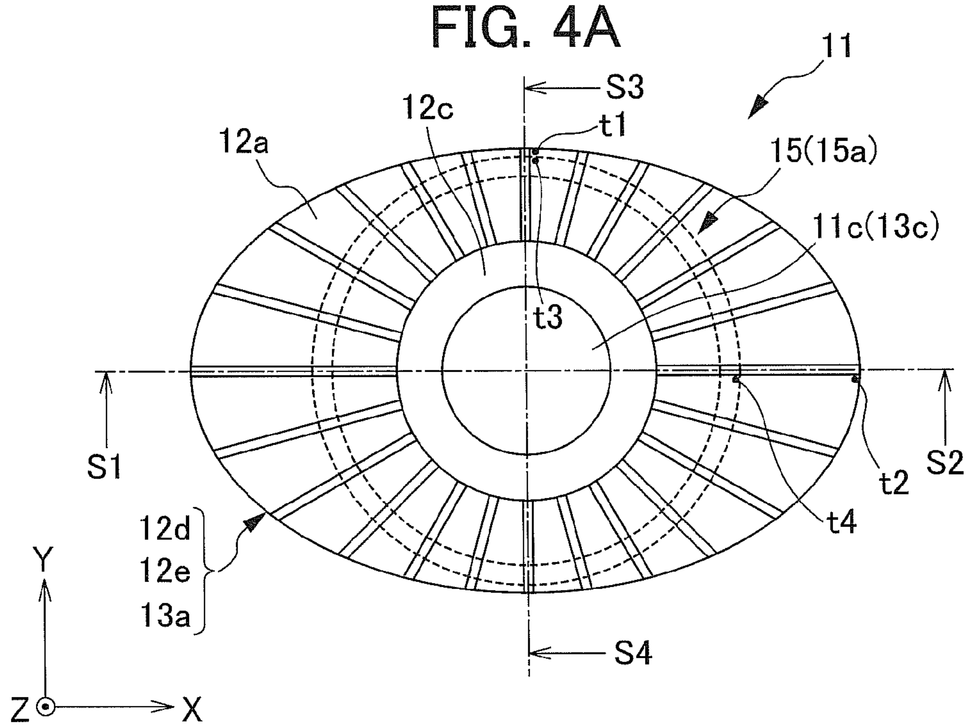
FIGS. 4A to 4C are drawings showing the vibrating element of the first embodiment.

The vibrating element 11 is a member with a hollow form, and having an elastic body 12, and a piezoelectric body 13 which is joined to the elastic body 12. The vibrating element 11 of the present embodiment, as shown in FIG. 4A described later, has an outer shape which is an approximately elliptical shape when viewed from the moving element 15 side, and in its central portion, a through-hole 11*c* having an approximately round shape is formed.

In this specification the word "round" means a shape in which every part of the circumference is equidistant from the center.

The elastic body 12 is a member formed of a metal material having a high resonance sharpness. The elastic body 12 has a hollow form, and its shape is an approximately elliptical shape when viewed from the moving element 15 side (refer to FIG. 4A), and this elastic body 12 has a comb tooth portion 12*a*, a base portion 12*b*, a flange portion 12*c*, and the like.

The comb tooth portion 12*a* is formed with a plurality of grooves cut at the surface on the opposite side of the surface joining the piezoelectric body 13 (the elastic body-side joining surface 12*e*), and the tip surface of this comb tooth portion 12*a* is in pressure contact with the moving element 15, and becomes the driving face 12*d* which drives the moving element 15. A lubricant surface treatment such as Ni—P (nickel-phosphorous) plating or the like is applied to this driving surface. The reason for providing the comb tooth portion 12*a* is to make the neutral plane of the progressive waves arising at the driving face 12*d* by the expansion and contraction of the piezoelectric body 13 get as close as possible to the side of the piezoelectric body 13, thereby increasing the amplitude of the progressive waves of the driving face 12*d*.

The base portion 12*b* is a portion which is continuous in the peripheral direction of the elastic body 12, and the piezoelectric body 13 is joined at the elastic body-side contact face 12*e*, which is the opposite side to the comb tooth portion 12*a* of the base portion 12*b*.

The flange portion 12*c* is a brim-shaped portion which projects in the inner radial direction of the elastic body 12, and is arranged in the center of the thickness direction of the base portion 12*b*. The vibrating element 11 is fixed to the fixed member 16 by this flange portion 12*c*.

Further, the details concerning the form of the elastic body-side joining face 12*e* and the driving face 12*d*, as well as the later described piezoelectric body-side joining face 13*a* will be explained later.

The piezoelectric body 13 is an electromechanical conversion element which converts electrical energy into mechanical energy. In the present embodiment, a piezoelectric element is used as the piezoelectric body, but it is also possible to use an electrostrictive element or the like.

The piezoelectric body 13 has an approximately planar shape, and has a piezoelectric body-side joining face 13*a* which is joined with the elastic body 12, and is a member with a hollow form where a through-hole 13*c* with a round shape is formed in the central portion of the piezoelectric body-side joining face 13*a* (refer to FIG. 4). In the piezoelectric body 13, the piezoelectric body-side joining face 13*a* is joined to the elastic body-side joining face 12*e* using an adhesive.

This piezoelectric body 13 has electrode portions formed thereon, not shown in the drawings, in order to input a driving signal.

The wiring of flexible printed circuit board 14 is connected to the electrode portions of the piezoelectric body 13. The flexible printed circuit board has the function of providing the driving signal to the piezoelectric body 13.

The elastic body 12 is excited by the expansion and contraction of the piezoelectric body 13 caused by the driving signal provided from this flexible printed circuit board 14, and progressive waves are generated on the driving face of the elastic body 12. In the present embodiment, four progressive waves are generated.

The moving element 15 is a member which is rotationally driven by the progressive waves arising on the driving face of the elastic body 12. The moving element 15 is a member having an approximately disk-like shape, formed of a light metal such as aluminum or the like, and has a contact face 15*a* which contacts the vibrating element 11 (the driving face 12*d* of the elastic body 12).

The contact face 15*a* has an approximately round shape, and a surface treatment of alumite or the like is applied to the surface of the contact face 15*a* in order to improve the abrasion resistance.

The output shaft 18 is a member having an approximately cylindrical shape. One end of the output shaft 18 contacts the moving element 15 via a rubber member 23, and it is arranged so as to rotate as one piece with the moving element 15.

The rubber member 23 is a member of an approximately round shape, formed of rubber. This rubber member 23 has the function of allowing the moving element 15 and the output shaft 18 to rotate as one piece due to the viscoelasticity of the rubber, and the function of absorbing vibrations so that vibrations from the moving element 15 are not transmitted to the output shaft 18, and butyl rubber, silicon rubber, propylene rubber and the like can be used.

The pressurizing member 19 is a member which generates pressure to make pressure contact between the vibrating element 11 and the moving element 15. This pressurizing member 19 is arranged between a gear 4 and a bearing receiving member 21. As the pressurizing member 19 in the present embodiment, a compression coil spring is used, but it is not limited to this.

The gear 4 is inserted so as to fit with a D-cut of the output shaft 18, and is fixed with a stopper 22 such as an E-ring or the like, and is arranged so as to be integral in the rotational direction and the axial direction with the output shaft 18. The gear 4, by rotating with the rotation of the output shaft 18, transmits driving power to the gear 5 (refer to FIG. 1).

Further, the bearing receiving member 21 is arranged at the inner radial side of the bearing 17, and the bearing 17 is constituted to be arranged at the inner radial side of the fixed member 16.

The pressurizing member 19 pressurizes the vibrating element 11 towards the moving element 15 side, in the axial direction of the shaft 18, and as a result of this pressure, the moving element 15 is in pressure contact with the driving face of the vibrating element 11, and is rotationally driven. Further, between the pressurizing member 19 and the bearing receiving member 21, a pressure adjusting washer may be arranged, so that an appropriate pressure can be obtained for the driving of the ultrasonic wave motor 10.

Next, the shape of the driving face 12*d*, the elastic body-side joining face 12*e* and the piezoelectric body-side joining face 13*a* will be explained.

FIG. 4 is a drawing showing the vibrating element 11 of the first embodiment. Further, in order to facilitate understanding, in FIG. 4 and the below shown FIG. 5, the orthogonal coordinate system XYZ is provided. The direction parallel to the axial direction of the output shaft 18 is set as the Z axis direction, and the direction facing the moving element 15 side in the Z axis direction is set as the Z axis positive direction. Then, the direction parallel to the long radius (long axis) of the elliptical shape of the outer shape of the vibrating element 11 viewed from the Z axis positive direction (the moving element 15 side) is set as the X axis direction, and the direction parallel to the short radius (short axis) is set as the Y axis direction.

Figure 4B:
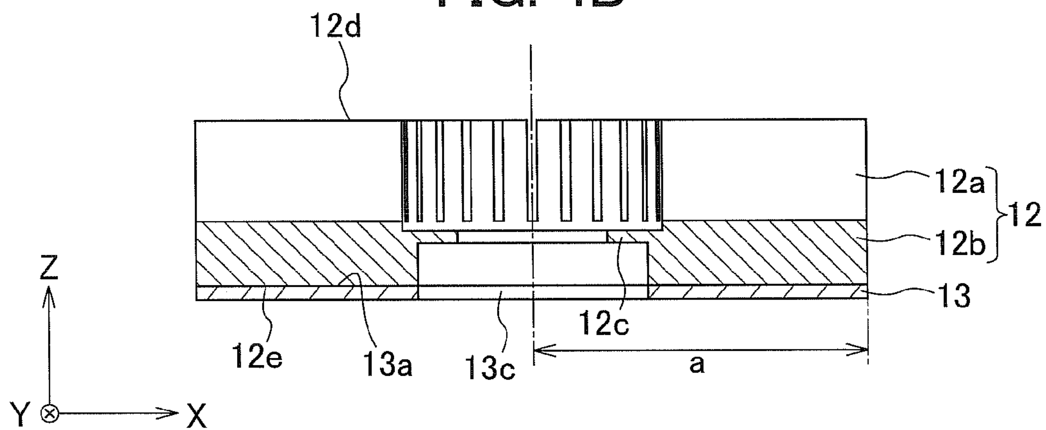
Figure 4C:
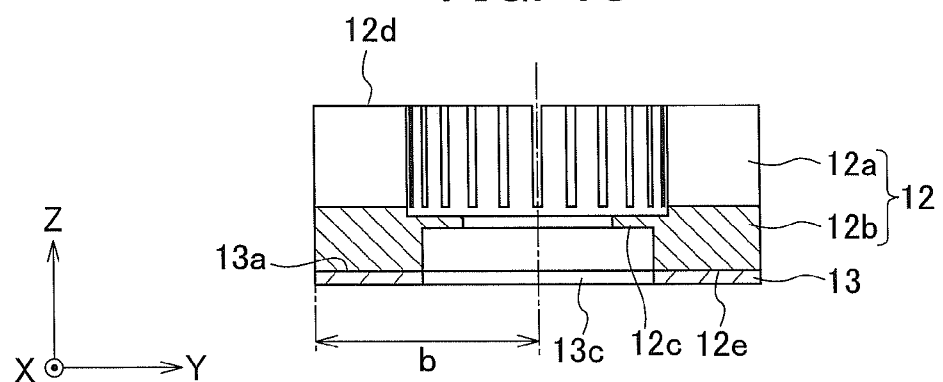

FIG. 4A is a drawing showing the vibrating element 11 as seen from the moving element 15 side, FIG. 4B is a cross sectional drawing of the vibrating element 11 along the cross section of the S1-S2 arrows, parallel to the XZ plane, and FIG. 4C is a cross sectional drawing of the vibrating element 11 along the cross section of the S3-S4 arrows, parallel to the YZ plane. Further, in FIG. 4A, the shape shown by the dotted lines is the shape of the contact face 15*a* of the moving element 15 contacting the driving face 12*d*, and the contact face 15*a* contacts the driving face 12*d* in the region shown by this dotted line.

The piezoelectric body 13 is member having an approximately planar shape, having a piezoelectric body-side joining face 13*a* joined to the elastic body 12, and a through-hole 13*c* with a round shape is formed in the center portion of the piezoelectric body-side joining face 13*a*. This piezoelectric body-side joining face 13*a* has an outer shape which is an elliptical shape when viewed from the elastic body 12 side (the Z axis positive side).

As shown in FIG. 4, the end face in the Z axis direction positive side of the elastic body 12 is the driving face 12*d*, and the end face in the Z axis direction negative side is the elastic body-side joining face 12*e*.

The outer shape of the elastic body-side joining face 12*e* is an elliptical shape. The shape of this elastic body-side joining face 12*e* approximately coincides with the shape of the piezoelectric body-side joining face 13*a*. Further, in the present embodiment, the outer shape of the driving face 12*d* approximately coincides with the outer shape of the elastic body-side joining face 12*e*, and when viewed from the moving element 15 side along the Z axis direction, as shown in FIG. 4A, the outer shapes of the piezoelectric body-side joining face 13*a*, the elastic body-side joining face 12*e*, and driving face 12*d* approximately coincide.

In the present embodiment, when a is the long radius of the elliptical shape which is the outer shape of the piezoelectric body-side joining face 13*a*, the elastic body-side joining face 12*e*, and the driving face 12*d*, and b is the short radius, the length ratio of the long radius and short radius is, a:b=1.5:1

Table 1 compares the ultrasonic wave motor of the present embodiment and ultrasonic wave motors of the Comparative Examples concerning the capacitance of the piezoelectric body and the like.

TABLE 1

| | Comparative Example 1 | Present Embodiment | Comparative Example 2 |
|---|---|---|---|
| Ratio a:b of long radius to short radius | 1:1 | 1.5:1 | 3:1 |
| Ratio of capacitance of piezoelectric body (for inner radius of 0) | 1 | 1.5 | 3 |
| Difference in vibration amplitude in radial direction of driving face | ○ | Δ | x |
| Irregularity in rotational speed in peripheral direction of moving element | ○ | Δ | x |

○ = good;
Δ = usable;
x = unusable

The ultrasonic wave motors of Comparative Example 1 and Comparative Example 2, not shown in the drawings, have approximately the same shape as the ultrasonic wave motor 10 of the present embodiment, except for the point that the outer shapes of the piezoelectric body-side joining face 13*a* and the like differ.

The vibrating element of the ultrasonic wave motor of Comparative Example 1 has an approximately round shape. Accordingly, the outer shapes of the piezoelectric body-side joining face, the elastic body-side joining face and the driving face of Comparative Example 1 are round shapes, and a:b=1:1. The outer diameters of the piezoelectric body-side joining face, the elastic body-side joining face, and the driving face of this Comparative Example 1 have the same length as the short radius b of the outer shape of the piezoelectric body-side joining face 13*a* of the present embodiment.

The outer shapes of the piezoelectric body-side joining face, the elastic body-side joining face and the driving face of the ultrasonic wave motor of Comparative Example 2 are elliptical-shapes, and the ratio of the long radius of the elliptical shape and the short radius is a:b=3:1. The short radius of the piezoelectric body-side joining face of this Comparative Example 2 has similar lengths to the short radius of the piezoelectric body-side joining face 13*a* of the present embodiment, and the long radius is twice as long as the length of the long radius of the piezoelectric body-side joining face 13*a* of the present embodiment.

The ratios of the capacitances of the piezoelectric bodies shown in Table 1 are the ratios of the capacitances of the piezoelectric body of the other Comparative Example and the present embodiment for the case that the capacitance of the piezoelectric body of Comparative Example 1 is set to 1. Further, this capacitance is for the case that the inner diameter c of the through-hole formed in the center of each of the piezoelectric bodies is c=0, namely, it is a comparison for the state in which the through-hole is not formed.

The difference in vibration amplitude in the radial direction of the driving face is a result of comparing the inner peripheral side and the outer peripheral side of the driving face of the driving face concerning the size of the vibration amplitudes of the progressive waves arising at the driving face. A small difference in the size of the vibration amplitude in the radial direction of the driving face is evaluated as "good" and indicated as "o" in Table 1; some difference in the radial direction, which is nonetheless suitable for use, is evaluated as "usable", and indicated as "Δ" in Table 1; and a large difference in the radial direction, which is not suitable for use, is evaluated as "unusable" and indicated as "x" in Table 1.

Further, the irregularity in the rotational speed in the peripheral direction of the moving element is an irregularity in the rotational speed in the peripheral direction of the contact face 15*a* when the moving element 15 is rotationally driven by the progressive waves of the driving face. In the peripheral direction of the contact face 15*a*, a small irregularity of the rotational speed is evaluated as "good" and indicated as "o" in Table 1; some irregularity in the rotational speed, which is nonetheless suitable for use, is evaluated as "usable" and indicated as "Δ" in Table 1; and a large irregularity in the rotational speed, which is not suitable for use, is evaluated as "unusable" and indicated as "x" in Table 1.

As shown in Table 1, it can be understood that the capacitance increases as the long radius a becomes larger. This is because, when the conditions of the thickness and dielectric property and the like are fixed, the capacitance of the piezoelectric body is proportional to the surface area of the polarized region of the piezoelectric body; therefore, by increasing the surface are of the piezoelectric body, the area of the polarized region can be increased. Namely, if the surface area of the joining face of the piezoelectric body and the elastic body increases, it is possible to increase the region of polarization of the piezoelectric body, and it is possible to increase the capacitance of the piezoelectric body. In this way, it is possible to obtain a larger driving force.

However, as shown in Table 1, as the ratio of the long radius a and the short radius b becomes large, the difference between the vibration amplitude in the radial direction of the driving face become large. The vibration amplitude of the progressive waves has a tendency to become large towards the outer peripheral side in the radial direction of the driving face. Accordingly, usually, compared to the inner peripheral side of the driving face, the outer peripheral side has a larger vibration amplitude of the progressive waves.

When the outer shape of the driving face is an elliptical shape, for example in the present embodiment, for the point t1 in the vicinity of the outer peripheral edge of the short radial direction of the driving face 12*d*, and the point t2 in the vicinity of the outer peripheral edge of the long radial direction, the size of the vibration amplitude differs, and the vibration amplitude of the point t2 is larger than the vibration amplitude of the point t1.

This change in the size of the vibration amplitudes is not simply proportional to the position in the radial direction, thus in the region contacting the contact face 15*a* of the moving element 15 (the region enclosed by the dotted lines in FIG. 4A), for example, for the point t3 positioned in the short radial direction of the driving face 12*d* of the present embodiment, and the point t4 positioned in the vicinity of the outer peripheral edge of the long radial direction, the vibration amplitude of the point t3 is large compared to the vibration amplitude of the point t4.

As is the case with the difference in the vibration amplitude of the progressive waves at the point t3 and the point t4, the difference in vibration amplitude in the region which the contact face 15*a* contacts becomes larger as the ratio of the long radius a of the elliptical shape of the driving face to the short radius b becomes larger (refer to Table 1).

As stated above, because differences in the vibration amplitude arise in the region where the contact face 15*a* contacts the driving face, irregularities arise in the rotational speed of the moving element 15 in its peripheral direction. If these irregularities in the rotational speed become large, it becomes impossible to carry out stable driving of the moving element 15, and reductions or the like in the driving performance and driving efficiency of the ultrasonic wave motor will arise.

However, in the present embodiment, the ratio of the long radius a to the short radius b, of the elliptical shape which form the outer shape of the driving face 12*d* and the like, is set to a:b=1.5:1, thus the desired driving power and stable driving can be made compatible.

Therefore, according to the present embodiment, it is possible to obtain an ultrasonic wave motor with good driving performance, even if miniaturized. For example, if an ultrasonic wave motor of the prior art, where the vibrating element has an round shape, is miniaturized, when a comparison is made for the case that the outer radius of the vibrating element has the same length as the short radius b of the present embodiment, the ultrasonic wave motor 10 of the present embodiment can provide greater torque.

Further, according to the present embodiment, the outer shape when viewed from the Z axis direction is elliptical. Accordingly, it can be located in a space where one length is long and the other length is short in the X axis and Y axis directions, when viewed from the Z axis direction, for example, as shown in FIG. 3, in the gap between the cam tube 6 in the inner portion of the lens barrel 3 and the outer tube of the lens barrel 3, thus the efficiency in terms of space is increased.

(Second Embodiment)

The ultrasonic wave motor of the second embodiment has approximately the same shape as the first embodiment, except for the point that the outer shape of the driving face 32*d* of the vibrating element 31 is different. Accordingly, the parts performing the same function as for the first embodiment described above have the same reference numbers, and overlapping explanations are omitted where appropriate.

Figure 5A:
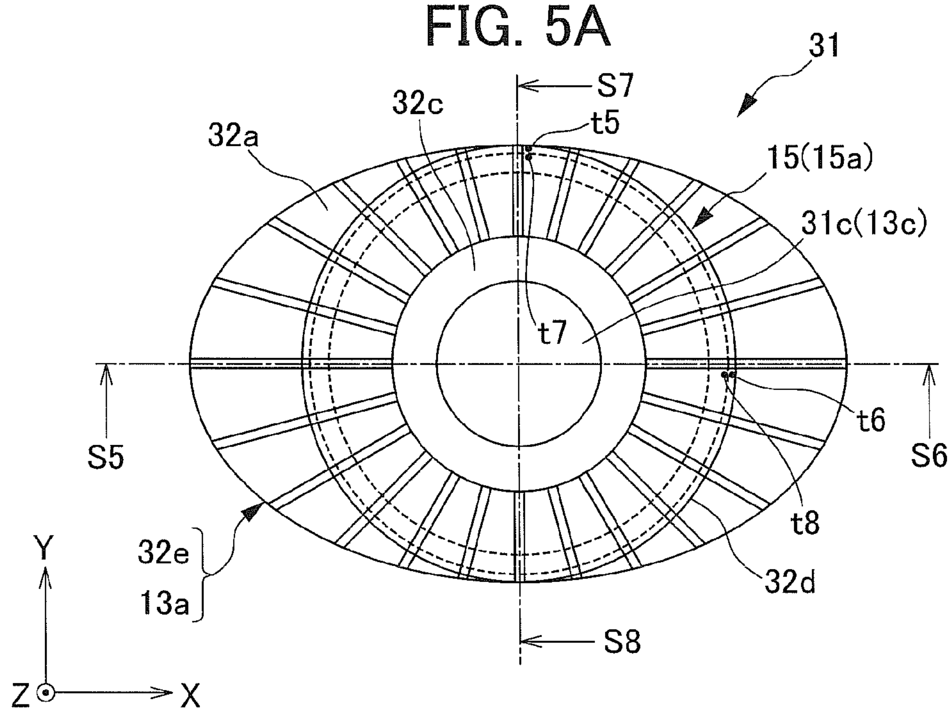
FIGS. 5A to 5C are drawings showing the vibrating element of the second embodiment.
Figure 5B:
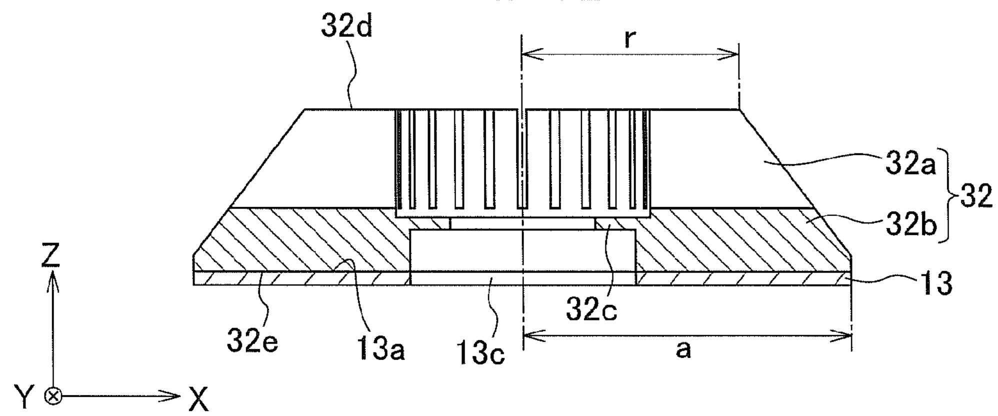
Figure 5C:
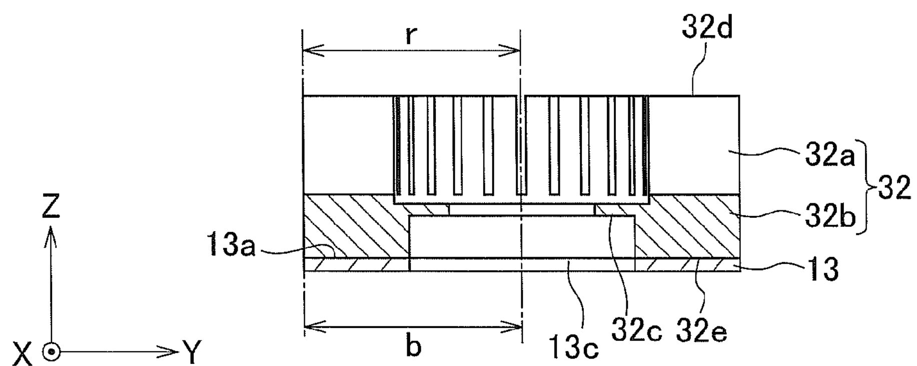

FIG. 5 is a drawing showing the vibrating element 31 of the ultrasonic wave motor of the second embodiment. FIG. 5A is a drawing of the vibrating element 31 viewed from the moving element 15 side; FIG. 5B is a cross-sectional drawing of the vibrating element 31 along the cross section of the S5-S6 arrows parallel to the XZ plane, and FIG. 5C is a cross sectional drawing of the vibrating element 31 along the cross section of the S7-S8 arrows parallel to the YZ axis. Further, the region shown by the dotted lines in FIG. 5A is the shape of the contact face 15*a* of the moving element 15 which contacts the driving face 32*d*, and is approximately the same as the region where the contact face 15*a* contacts the driving face 32*d*.

The vibrating element 31 of the second embodiment has an elastic body 32, a piezoelectric body 13, and a through-hole 31*c*. The through-hole 31*c* has a shape approximately the same as the through-hole 11*c* of the first embodiment.

The elastic body 32 of the second embodiment has a comb tooth portion 32*a*, a base portion 32*b*, a flange portion 32*c*, a driving face 32*d*, and an elastic body-side joining face 32*e*. The comb tooth portion 32*a*, the base portion 32*b*, the flange portion 32*c*, and the elastic body-side joining face 32*e* are parts which perform approximately the same function as the functions shown for the first embodiment, but the outer shape of the driving face 32*d* differs from the first embodiment, thus the shapes of the outer peripheral sides of the comb tooth portion 32*a* and the base portion 32*b* are different from those of the first embodiment (refer to FIG. 5B). These differences in shape will be described below.

The driving face 32*d*, as shown in FIG. 5A and the like, has a shape which when viewed from the moving element 15 side (the Z axis positive side) is an round shape with an outer radius r, and is a similar shape to the contact face 15*a* of the moving element 15.

The center of the driving face 32*d* and the center of the elliptical shape of the elastic body-side joining face 32*e* are located on the same straight line parallel to the Z axis direction, and the length of the outer radius r of the driving face 32*d* is the same as the length of the short radius b of the elastic body-side joining face 32*e*, $r=b=(2/3)\times a$.

As shown in FIGS. 5B and 5C, in the short radius direction (Y axis direction) of the elastic body-side joining face 32*e*, the dimension of the elastic body-side joining face 32*e* (2×b), and the dimension of the driving face 32*d* (2×r) are the same, but in the long radius direction (X axis direction) of the elastic body-side joining face 32*e*, the dimension of the driving face 32*d* (2×r) is smaller than the dimension of the elastic body-side joining face 32*e* (2×a).

Accordingly, the outer shape of the driving face 32*d* is small compared to the outer shape of the elastic body-side joining face 32*e*, and as shown in FIG. 5B, a portion of the outer peripheral side of the comb tooth portion 32*a* and the base portion 32*b* have a shape which is inclined towards the inner peripheral side.

The driving face 32*d* of the present embodiment has an outer shape which is a round shape, thus the progressive waves arising on the driving face 32*d* have a small difference in the size of the vibration amplitude in the peripheral direction. For example, the difference in the size of the vibration amplitude of the progressive waves of the point t5 located in the vicinity of the outer peripheral edge in the Y axis direction on the driving face 32*d*, and the point t6 located in the vicinity of the outer peripheral edge in the X axis direction, is small compared to the difference of the vibration amplitude of the progressive waves at the points t1 ad t2 (refer to FIG. 5A) shown for the above described first embodiment.

Further, by making the outer shape of the driving face 32*d* a round shape, for the region where the contact face 15*a* contacts the driving face 32*d*, the position in the radial direction of the outer radius of the driving face 32*d* is approximately constant regardless of the position in the peripheral direction.

Accordingly, in the region of the driving face 32*d* which contacts the contact face 15*a* (the region shown by the dotted lines in FIG. 5A), the difference in the size of the vibration amplitude of point t7 located in the Y axis direction and the point t8 located in the X axis direction is small.

From the above, according to the present embodiment, the difference in the size of the vibration amplitude in the peripheral direction of the region of the driving face 32*d* which contacts the contact face 15*a* is small, and the irregularity of the rotational speed in the peripheral direction of the moving element 15 can be made small. Accordingly, the moving element 15 can be stably driven, and the driving performance of the ultrasonic wave motor can be improved.

Further, according to the present embodiment, in the same way as for the first embodiment, the ultrasonic wave motor can be miniaturized without reducing the driving force.

Furthermore, the radius r of the driving face 32*d* has the same length as the short radius b of the elastic body-side joining face 32*e*, thus the region which contacts the contact face 15*a* can be made the outer peripheral side in the radial direction of the driving face 32*d*, regardless of the position in the peripheral direction. Accordingly, it is possible to drive the moving element 15 by a greater vibration amplitude, and the torque of the ultrasonic wave motor can be improved.

(Modifications)

The present invention is not limited to the above-described embodiments, and many modifications or alterations are possible.

(1) In each of the embodiments, an example was shown where the outer shapes of the piezoelectric body-side joining face 13*a* and the elastic body-side joining face 12*e*, 32*e* have an elliptical shape, but this is not a limitation, and for example, they may be polygonal, to further increase the efficiency in the use of space.

(2) In each of the embodiments, a rotationally driven ultrasonic wave motor was given as an example to explain the moving element 15, but this is not a limitation, and the moving element can be applied to a vibration actuator of a linear type which is driven in a straight line.

(3) In each of the embodiments, an ultrasonic wave motor using vibrations in the ultrasonic wave region was used as an example for the explanation, but this is not a limitation, and for example, it can be applied to a vibration actuator using vibrations outside of the ultrasonic wave region.

(4) In each of the embodiments, an example of an ultrasonic wave motor used to drive a lens at the time of the focusing operation is shown, but this is not a limitation, and for example, the ultrasonic wave motor can be used for driving at the time of the zooming operation of a lens.

(5) In each of the embodiments, an example of an ultrasonic wave motor used for a camera is shown, but this is not a limitation, and for example, it can be used as a driving portion of a copying machine, or a driving portion of a steering wheel tilt device or headrest of an automobile.

Further, the above embodiments and modifications can also be used in appropriate combinations, but detailed explanations thereof are omitted. Further, the present invention is not limited by the above-explained embodiments.

What is claimed is:

1. A vibration actuator comprising:

an electromechanical conversion element, having a first joining face of an elliptical contour, and which is subject to excitation;

an elastic body having a second joining face of an elliptical contour which is joined to the first joining face, and a driving face which gives rise to vibration waves as a result of said excitation; and a relative moving member of a ring shape, having a contact face of a circular contour which is in pressure contact with the driving face, which is driven by the vibration waves, and which moves relative to the elastic body.

2. The vibration actuator according to claim 1, wherein:

in the first joining face, a width in a direction orthogonal to a progressive direction of the relative moving member differs depending on the position in the progressive direction of the relative moving member.

3. The vibration actuator according to claim 1, wherein:

in the first joining face, a width in a radial direction of the contact face is nonuniform.

4. The vibration actuator according to claim 1, wherein:

the outer shape of the contact face is smaller than an outer shape of the second joining face.

5. The vibration actuator according to claim 1, wherein:

an outer shape of the driving face is smaller than an outer shape of the second joining face.

6. The vibration actuator according to claim 1, wherein:

a short radius of the second joining face is approximately the same as a length in a direction parallel to a short radius of the driving face.

7. The vibration actuator according to claim 1, wherein:

the second joining face has a shape which is approximately the same as the first joining face.

8. The vibration actuator according to claim 1, wherein:

the driving face has a similar shape to the contact face.

9. A lens barrel comprising the vibration actuator according to claim 1.

10. The lens barrel according to claim 9, further comprising:

a lens unit driven by the vibration actuator;

a lens retaining mount which retains the lens unit; and a housing which encloses the lens retaining mount, wherein:

the vibration actuator is positioned between the lens retaining mount and the housing.

11. A camera comprising the vibration actuator according to claim 1.

12. The vibration actuator according to claim 1, wherein the vibration waves generated on the driving face comprise progressive vibration waves.

* * * * *